United States Patent [19]

Scholl et al.

[11] Patent Number: 4,766,470
[45] Date of Patent: Aug. 23, 1988

[54] EDGE EMITTING, LIGHT-EMITTING DIODE

[75] Inventors: Frederick W. Scholl, Riverdale; Stephen J. Anderson, Yorktown Heights; Michael H. Coden, Bronx, all of N.Y.

[73] Assignee: Codenoll Technology, Yonkers, N.Y.

[21] Appl. No.: 125,812

[22] Filed: Nov. 24, 1987

Related U.S. Application Data

[63] Continuation of Ser. No. 42,607, Apr. 21, 1987, abandoned, which is a continuation of Ser. No. 582,844, Feb. 23, 1984, abandoned.

[51] Int. Cl.[4] .................... H01L 33/00; H01S 3/19
[52] U.S. Cl. ................................ 357/17; 372/45; 372/49; 357/61; 357/16
[58] Field of Search .............. 357/17, 16, 61; 372/45, 372/49

[56] References Cited

U.S. PATENT DOCUMENTS

| | | | |
|---|---|---|---|
| 3,456,209 | 7/1969 | Diemer | 372/45 |
| 3,758,875 | 9/1973 | Hayashi | 372/45 |
| 3,938,172 | 2/1976 | Lockwood | 372/45 |
| 3,982,207 | 9/1976 | Dingle et al. | 372/45 |
| 3,993,963 | 11/1976 | Logan et al. | 372/45 |
| 4,063,189 | 12/1977 | Scifres et al. | 372/45 |
| 4,152,044 | 5/1979 | Liu | 350/96.12 |
| 4,184,170 | 1/1980 | Burnham et al. | 357/17 |
| 4,190,809 | 2/1980 | Goodman et al. | 372/46 |
| 4,309,670 | 1/1982 | Burnham et al. | 357/17 |
| 4,317,086 | 2/1982 | Scifres et al. | 372/49 |
| 4,325,034 | 4/1982 | Dyment et al. | 372/50 |
| 4,359,774 | 12/1982 | Olsen et al. | 357/17 |
| 4,596,501 | 5/1986 | Scholl | 357/17 |

OTHER PUBLICATIONS

Olsen et al., "High Performance 1.3 μm InGaAsP Edge Emitting LEDs", Ink Material Electron Device Meeting, Dec. 8-10, 1980, pp. 530-533.

Thompson, *Physics of Semiconductor Laser Devices*, John Wiley & Son, pp. 55-99.

Ettenberg et al., "High Radiance Edge-Emitting LED", Jun. 1976, IEEE Journal of Quantum Electronics, vol. QE12, No. 6, pp. 360-364.

*Primary Examiner*—James W. Davie
*Assistant Examiner*—Georgia Y. Epps
*Attorney, Agent, or Firm*—Pennie & Edmonds

[57] ABSTRACT

A high efficiency edge-emitting LED is disclosed in which optical radiation produced in an active layer of the device leaves the device without being substantially absorbed by the material comprising the active layer. The device is constructed so that an optical waveguide is formed such that light produced in the active layer either leaves the device without any reflections or with a maximum of one reflection. The thickness of the active layer and the compositions of the active layer and confining layers are chosen so that electrical carriers are confined in the active layer while light produced in the active layer is not confined therein.

21 Claims, 4 Drawing Sheets

EDGE EMITTING, LIGHT-EMITTING DIODE

This is a continuation of application Ser. No. 042,607, filed Apr. 21, 1987, which is a continuation of application Ser. No. 582,844, filed Feb. 23, 1984, both now abandoned.

BACKGROUND OF THE INVENTION

The present invention relates to a high efficiency semiconductor light emitting diode (LED) of the edge-emitting type with a cutoff waveguide for use in high speed fiber optical communications.

The two types of semiconductor LED's most often used in fiber optical communication systems are the surface etched well emitter (Burrus type) and the edge-emitter. In the surface emitter, light is emitted from the surface of a planar LED structure along a path that is perpendicular to the p-n junction plane of the device. An optical fiber is aligned with this path to receive the emitted light. A well is etched into the top of the structure to enable the fiber to be as close as possible to the light emitting active region of the device.

The structure of the edge-emitter is very similar to that of a double heterojunction semiconductor laser. In the edge-emitter, the device is composed of layers of semiconductor material doped so that a p-n junction plane is formed. When the junction is forward biased, injected carriers (electrons and holes) recombine in the active layer and light is generated. The light is emitted from an edge of the device along a path which is parallel to the junction plane of the active layer. An optical fiber is aligned with this path at the edge of the device where the light is emitted.

Edge-emitters are potentially cheaper to fabricate and easier to package than surface emitters; however, the total optical power output of an edge-emitter is typically a fraction of that from comparable surface emitters. This lower output power level is caused by the reabsorption of light within the active region of the device.

In conventional edge-emitting LED's, the active layer is typically surrounded by two confining layers which in turn are surrounded by two optical guide layers and light is emitted from the LED after multiple internal reflections at the interface between a confining layer and an optical guide layer. Because the material composing the active layer absorbs optical energy produced when the carriers recombine, the active layer is usually constructed so that it is relatively thin (about 0.1 microns) in order to increase the optical efficiency of the device. However, manufacturing LED's with such thin active layers is difficult and therefore expensive.

SUMMARY OF THE INVENTION

This invention relates to a new structure for a high efficiency edge-emitting LED in which the optical radiation produced in an active layer of the device leaves the device without being substantially absorbed by the material comprising the active layer. The LED comprises an active layer in which carrier recombination occurs resulting in the generation of light, and a p and an n confining layer on opposite sides of the active layer which confine carrier recombination within the active layer.

To provide for efficient generation of light in the active layer, minimum compositional differences are maintained between the active layer and the confining layers so as to confine electrical carriers in the active layer. Illustratively, in the case of an LED formed of $Al_xGa_{1-x}As$, these differences are at least $\Delta x=0.20$ for the electron barrier between the active layer and the p confining layer and $\Delta x=0.10$ for the hole barrier between the active layer and the n confining layer.

In a preferred embodiment of the invention, the compositions of the confining layers are different from each other, resulting in an asymmetric structure, so that light generated in the active layer is not confined within the energy absorbing active layer. This feature permits an LED to be constructed with thicker active layers than in conventional LEDs, while maintaining a high optical power output. Manufacturing LEDs with a thicker active layer is a simpler and thus less expensive process. Further, the active and confining layers are in turn surrounded by internal reflection layers of lower index of refraction or by reflective metal layers which form an optical cavity which confines the light produced within the confining and active layers by reflection. In addition, the emitting facet of the device is covered by an anti-reflection coating to increase the intensity of the light output from the device.

The thicknesses of the confining layers are chosen so that the light generated in the active layer leaves the device either without reflection or after a single reflection. This feature allows the light generated to leave the device after passing through a minimum distance in the energy absorbing material comprising the active layer thus resulting in a high efficiency device.

BRIEF DESCRIPTION OF THE DRAWINGS

These and other objects, features, and advantages of the invention will be more readily apparent from the following description of a preferred embodiment of the invention in which.

DESCRIPTION OF THE PREFERRED EMBODIMENTS

Figure 1:
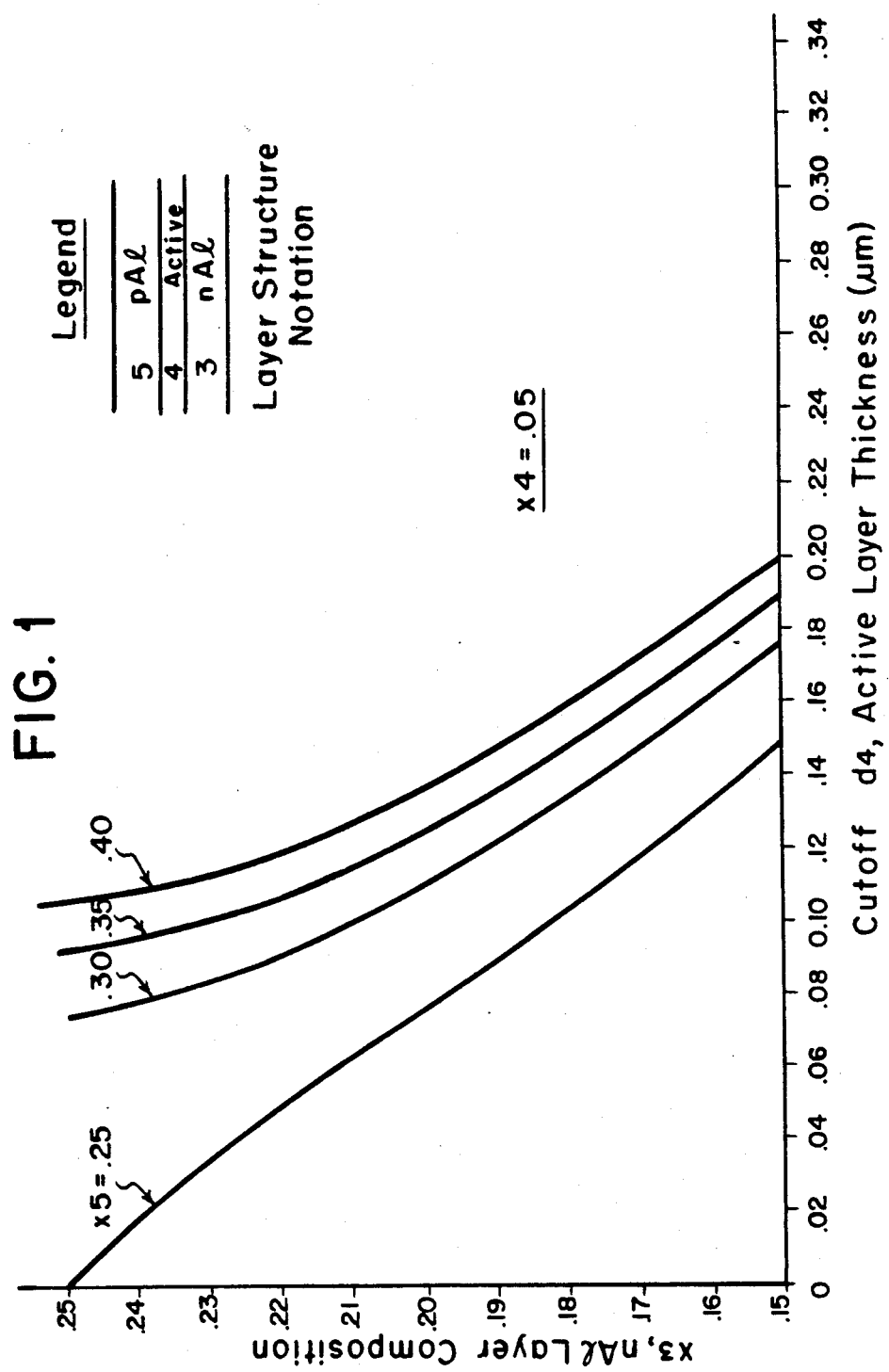
FIG. 1 is a graphical representation of the parameters of an illustrative embodiment of an asymmetric edge-emitting light emitting diode of the present invention.

Several embodiments of the edge-emitting LED of this invention are described in detail hereafter with reference to the cross-sectional views of FIGS. 2 to 5. Each LED is typically fabricated as a body of single crystalline semiconductor material in the form of a parallelepiped. The general design of the LED incorporates an asymmetrical waveguide and reflective interfaces which are formed by several substantially planar layers of III—IV ternary compounds of semiconductor material, preferably $Al_xGa_{1-x}As$. The layers are doped with donor and acceptor impurities so that the layers become n-type or p-type.

The LED comprises: n-type substrate layer 1, n-type reflector layer 2, n-type confining layer 3, active layer 4, p-type confining layer 5, p-type reflector layer 6, p-type cap layer 7, ohmic contact stripe 8, and a heat sink 15, preferably BeO. Active layer 4 may be either p-type or n-type. Illustratively it is p-type so that a pn junction 13 is formed between layers 3 and 4. Ohmic contact stripe 8 only partially covers p-type cap layer 7 as the length and width of ohmic contact stripe 8 are less than those of p-type cap layer 7. Recombination of carriers primarily occurs in active layer 4 below ohmic contact stripe 8 and between emitting facet 9 and endpoint 10. Optical radiation produced in active layer 4 leaves the device at emitting facet 9 and typically enters an optical fiber 20.

To increase the intensity of the optical radiation generated by the device, emitting facet 9 is covered with an anti-reflective coating 11, such as $SiO_2$, SiO or $Si_3N_4$ of a thickness equal to about one quarter of the wavelength of the optical radiation produced by the LED. The other facets of the device (not shown) are coated with a reflective coating to minimize light losses.

Although ohmic contact stripe 8 is used to provide the device with current flow, other methods can be used such as proton bombardment, Zn diffusion or a reverse biased p-n junction.

The optical radiation produced in active layer 4 radiates from active layer 4 within the device at a producing angle $\theta$ measured from the plane of active layer 4. Optical radiation leaves the device at an exit angle $\alpha$ measured from the normal to emitting facet 9.

The thickness of a particular layer is designated $d_i$ and the index of refraction of that layer is designated $n_i$ where i is the number of the layer. Similarly, the composition of a layer is designated $Al_xGa_{1-x}As$, where $x_i$ is the ratio of aluminum to the total amount of aluminum and gallium in the ith layer. Hence, $0 \leq x_i \leq 1$.

The relative values of the index of refraction of each layer may be achieved by varying the relative concentrations of gallium and aluminum, because as is described in S. M. Sze, *Physics of Semiconductor Devices*, p. 715 (1981), the index of refraction, n(x), of the ternary compound $Al_xGa_{1-x}As$ decreases with increasing concentration x of aluminum according to the relation:

$$n(x) = 3.590 - 0.710x + 0.091x^2 \quad (1)$$

When a forward bias voltage (not shown) is applied to the p-n junction 13 of the device, carriers (electrons and holes) are injected and contained within active layer 4, and light is generated when oppositely charged carriers recombine.

By carefully selecting the thickness of active layer 4 and the compositions of n-type confining layer 3, active layer 4 and p-type confining layer 5, electrical carriers are confined in active layer 4 where they recombine to produce optical radiation, while optical radiation is permitted to leave the energy absorbing material of active layer 4.

First, to confine the electrical carriers to the active layer, a minimum compositional difference must be maintained between the active layer and each confining layer. If $x_i$ is the ratio of aluminum to the total amount of aluminum and gallium in the ith layer, and $\Delta x_{i,i+1}$ is the difference in such composition ratio between two adjacent layers, then the desired differences are $\Delta x_{3,4} = 0.10$ between n-type confining layer 3 and active layer 4 and $\Delta x_{4,5} = 0.20$ between active layer 4 and p-type confining layer 5.

To permit light to escape from the active layer 4, the confinement factor Y, which is a function of the thickness of the active layer and the composition of the confining layers, must be approximately zero. FIG. 1 is a graphical representation of these conditions. The curves depict the particular values at which the confinement factor, $\gamma$, decreases to approximately zero, at which point all light produced within active layer 4 escapes into n-type confining layer 3 and p-type confining layer 5. As will be apparent, the curves are a family of curves of the aluminum concentration $x_5$ of p-type confining layer 5 versus the aluminum concentration $x_3$ of n-type confining layer 3 and the thickness $d_4$ of active layer 4 in the case where the aluminum concentration $x_4$ of active layer 4 is 0.05. For the confinement factor to be zero, the thickness $d_4$ of the active layer must decrease as the composition of the two confining layers comes closer together.

Although the curves are plotted for the confinement factor, $\gamma$, approximately equal to zero for optical radiation as measured in the Transverse Electric (TE) mode, a waveguide analysis indicates that the curves also depict when the confinement factor, $\gamma$, as measured in the Transverse Magnetic (TM) mode is approximately equal to zero. (The TE mode of electromagnetic radiation is equal to the magnitude of the electric field E in the direction perpendicular to the direction of propagation of the electric field E, while the TM mode of electromagnetic radiation is equal to the magnitude of the magnetic field M in the direction perpendicular to the direction of propagation of the magnetic field M.)

In fabricating the LED, the aluminum concentration $x_4$ of the active layer illustratively is $x_4 = 0.05$. To confine electrical carriers, $\Delta x_{3,4}$ should be at least 0.10 and $\Delta x_{4,5}$ at least 0.20. Hence, the aluminum concentration of n-type confining layer 3 should be at least: $x_3 = x_4 + \Delta x_{3,4} = 0.05 + 0.10 = 0.15$, and that of p-type confining layer 5 should be at least: $x_5 = x_4 + \Delta x_{4,5} = 0.05 + 0.20 = 0.25$. From FIG. 1, it can be seen that these values correspond to a thickness $d_4$ of active layer 4 of $d_4 = 0.15$ microns, a value substantially higher than that used in conventional edge-emitting light emitting diodes.

Advantageously, the thicknesses of n-type confining layer 3 and p-type confining layer 5 are chosen to avoid absorption of the optical radiation by active layer 4 as the radiation passes through active layer 4. To avoid optical absorption by active layer 4, the device is constructed so that optical radiation produced in active layer 4 encounters an interface 23 of n-type reflector layer 2 and n-type confining layer 3 or an interface 25 of p-type reflector layer 6 and p-type confining layer 5 no more than once before the optical radiation leaves the device at emitting facet 9. By this means, radiation leaving active layer 4 does not encounter active layer 4 again as it passes to emitting facet 9.

Figure 2:
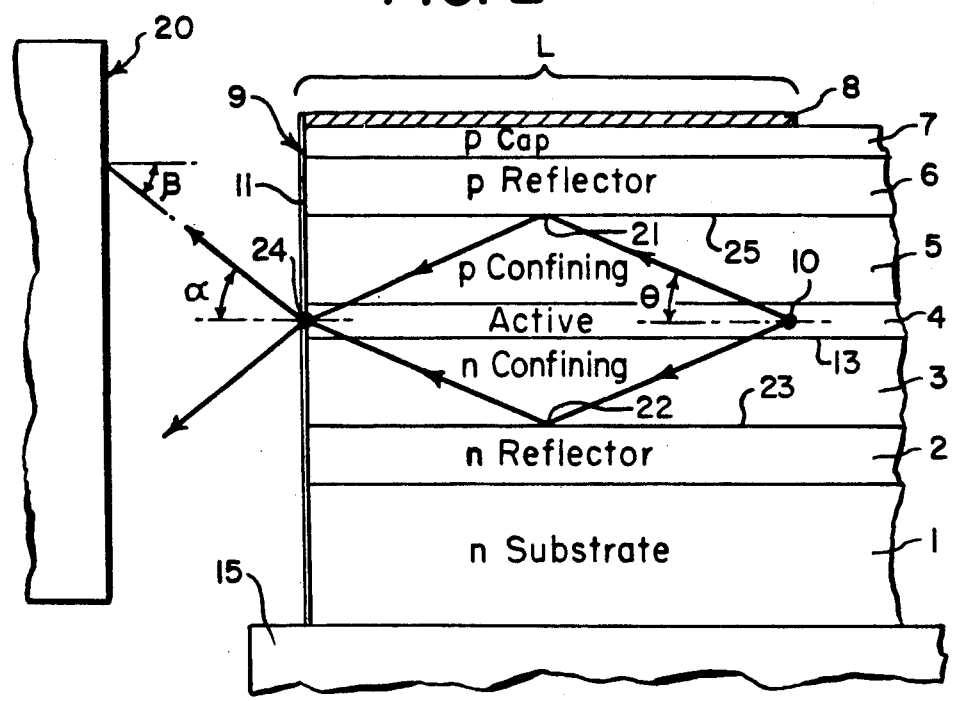
FIG. 2 is a cross-sectional drawing of a general structure of a first embodiment of an edge-emitting light emitting diode of the present invention.

Since the optical radiation produced by the LED is intended to be used in fiber optic communications, the optical properties of the fiber such as optical fiber 20 of FIG. 2 are used to determine the optimal construction of the LED device. In practice, a fiber with a 100 micron core is typically used with a numerical aperture (NA) of 0.3.

The fiber acceptance angle $\beta$, which is measured from the normal to the entrance facet of the fiber, is related to the index of refraction $n_o$ of the medium at the entrance of the fiber (typically air) and the numerical aperture NA of the fiber by the following relation:

$$\sin \beta = \frac{NA}{n_o} \quad (2)$$

For $n_o=1.0$ (for air) and NA=0.3, $\beta=17.5°$. If this fiber is appropriately lensed or tapered, we obtain an effective numerical aperture of 0.5, and rays with $\beta \leq 30°$ propagate down the fiber core.

Typically, the entrance facet of optical fiber is mounted parallel to the exit facet of the LED and there are no other intervening lenses or other focusing devices. As a result, all optical radiation emitted from the LED at an angle less than $\alpha=30°$ is accepted by the fiber for optical transmission.

Using Snell's law, one can find the angle within which optical radiation that is accepted by fiber 20 travels within the LED:

$$n_o \sin \alpha = n_c \sin \theta \quad (3)$$

where $n_c$ is an average index of refraction for n-type confining layer 3 and p-type confining layer 5. Assuming an average aluminum composition for n-type confining layer 3 and p-type confining layer 5 to be approximately $x_c=0.20$, then $n_c=3.45$. Accordingly, the producing angle $\theta$ is:

$$\eta = \sin^{-1}[(\sin 30°)/3.45] = 8.3° \quad (4)$$

Thus, all optical radiation which travels within the device at a producing angle $\theta$ less than $\theta=8.3°$ will leave the device at an exit angle less than or equal to 30° and therefore will be accepted by the optical fiber. By using the exact compositions of n-type confining layer 3 and p-type confining layer 5 instead of an average composition, $x_c$, the difference in the calculated value of $\theta$ changes by only a few tenths of a degree.

Optical radiation produced in active layer 4 between emitting facet 9 and endpoint 10 and accepted by optical fiber 20 will leave the LED before encountering the interface 23 of n-type confining layer 3 and n-type reflector layer 2 or the interface 25 of p-type confining layer 5 and p-type reflector layer 6 if $$d \geq L \tan \theta \quad (5)$$

where d is equal to the confining layer thickness and L is the length of ohmic contact stripe 8. For $\theta=8.5°$ and L=100 microns, the thicknesses of the confining layers are calculated by equation (5) to be $d_c=15$ microns.

By making the interface 23 of n-type confining layer 3 and n-type reflector layer 2 and the interface 25 of p-type confining layer 5 and p-type reflector layer 6 surfaces which reflect the optical radiation produced in active layer 4, the thicknesses of n-type confining layer 3 and p-type confining layer 5 may be reduced. A reduction in the thicknesses of the confining layers reduces compositional grading, improves thermal impedance and allows better control of current spreading. If the optical radiation produced in active layer 4 and accepted by optical fiber 20 passes through the confining layers with only a single reflection at the interface of the confining layer and the reflector layer and then leaves the device before reentering active layer 4, then the thicknesses of the confining layers may be reduced to one half the thicknesses used for a device in which the optical radiation produced in active layer 4 and accepted by optical fiber 20 leaves the device without any reflection.

Reflective surfaces for an optical waveguide may be formed in two ways: (1) deposition of metal layers of high reflectivity onto the surfaces of the confining layers not in contact with active layer 4; or (2) deposition of semiconductor reflector layers onto the surfaces of the confining layers not in contact with active layer 4, the index of refraction of the reflector layers being less than that of the confining layers so that an optical cavity is formed in which total internal reflection occurs.

The compositions of the semiconductor reflector layers may be calculated using Snell's law for total internal reflection. Using the maximum producing angle calculated above, $\theta=8.5°$, and a confining layer with an aluminum concentration $x_c=0.25$, $n_c=3.43$, and the index of refraction of the reflector layer $n_r$ is:

$$\begin{aligned} n_r &\geq n_c \sin(90° - \theta) \quad (6)\\ &\geq (3.43) \sin(90° - 8.5°)\\ &\geq 3.39 \end{aligned}$$

Using this value of $n_r$, the aluminum concentration in the reflector layer can then be calculated from equation (1) to be $x_r \geq 0.32$.

The width and length of ohmic contact stripe 8 are chosen to optimize device performance. Typically, the width of ohmic contact stripe 8 is chosen to be about one half the diameter of the core of the optical fiber. The length of ohmic contact stripe 8 is then chosen to maintain an acceptable current density.

EXAMPLE 1

FIG. 2 is a cross-sectional drawing (not to scale) of the general structure of an asymmetric cutoff reflector edge-emitting LED of the present invention. The individual layers have previously been identified. Light is produced in active layer 4 below ohmic contact stripe 8 and between emitting facet 9 and endpoint 10. Optical radiation generated at endpoint 10 travels through the device within a cone outlined by the rays from endpoint 10 to reflection point 21 and to exit point 24 and from endpoint 10 to reflection point 22 to exit point 24. At reflection points 21 and 22, the optical radiation is reflected by total internal reflection. The optical radiation leaves the device through emitting facet 9 at exit point 24 after passing through anti-reflective coating 11 to be accepted by optical fiber 20.

The thickness of active layer 4 and the composition of n-type confining layer 3, active layer 4, and p-type confining layer 5 are chosen as described above so that carrier recombination occurs primarily in active layer 4 and that the light generated therein is not confined to the active layer. The composition of n-type reflector layer 2 is chosen so that the index of refraction of n-type reflector layer 2 is less than that of n-type confining layer 3 so that light generated in active layer 4 experiences total internal reflection at the interface 23 of n-type confining layer 3 and n-type reflector layer 2. Similarly, the composition of p-type reflector layer 6 is chosen so that the index of refraction of p-type reflector layer 6 is less than that of p-type confining layer 5 so that light generated in active layer 4 experiences total internal reflection at the interface 25 of p-type confining layer 5 and p-type reflector layer 6.

The thickness $d_3$ of n-type confining layer 3 and the thickness $d_5$ of p-type confining layer 5 are chosen to be one half the nominal value necessary to allow optical radiation generated at endpoint 10 to pass through a confining layer without reflection and be accepted by the optical fiber. Only one half the nominal layer thickness value is required since the aluminum concentrations of n-type reflector layer 2 and p-type reflector layer 6 are chosen to provide an optical cavity in which total internal reflection occurs at the interfaces 23 and 25.

EXAMPLE 2

Figure 3:
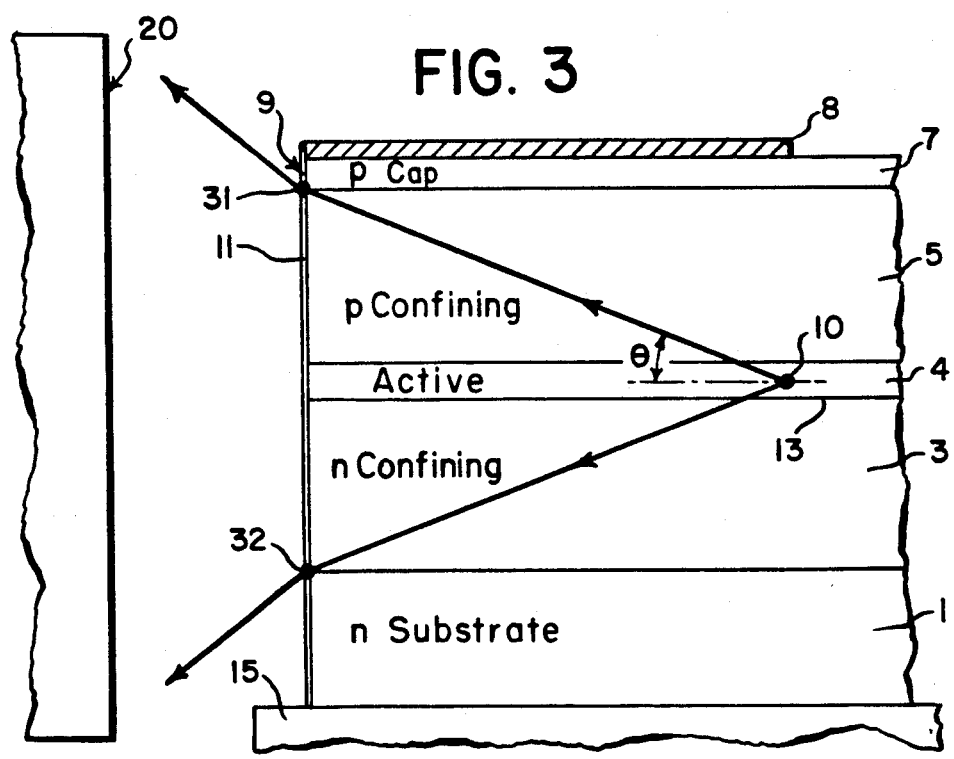
FIG. 3 is a cross-sectional drawing of a second embodiment of an edge-emitting light emitting diode of the present invention.

FIG. 3 is a cross-sectional drawing (not to scale) of a second asymmetric cutoff LED of the present invention. As is the case for Example 1, the thickness of active layer 4 and the composition of n-type confining layer 3, active layer 4, and p-type confining layer 5 are chosen so that carrier recombination is confined primarily in active layer 4 and the light generated therein is not confined to the active layer.

The thickness $d_3$ of n-type confining layer 3 and the thickness $d_5$ of p-type confining layer 5 are chosen to permit optical radiation generated within active layer 4 below the back end of ohmic contact stripe 8 at endpoint 10 to travel through the device without encountering any additional semiconductor layers. Therefore, for the LED of Example 2, there is no need for n-type reflector layer 2 and p-type reflector layer 6.

Thus, optical radiation generated at endpoint 10 travels through the device within a cone outlined by the rays from endpoint 10 to point 31 and from endpoint 10 to point 32. The optical radiation then passes through anti-reflective coating 11 on emitting facet 9 to be accepted by the optical fiber.

EXAMPLE 3

Figure 4:
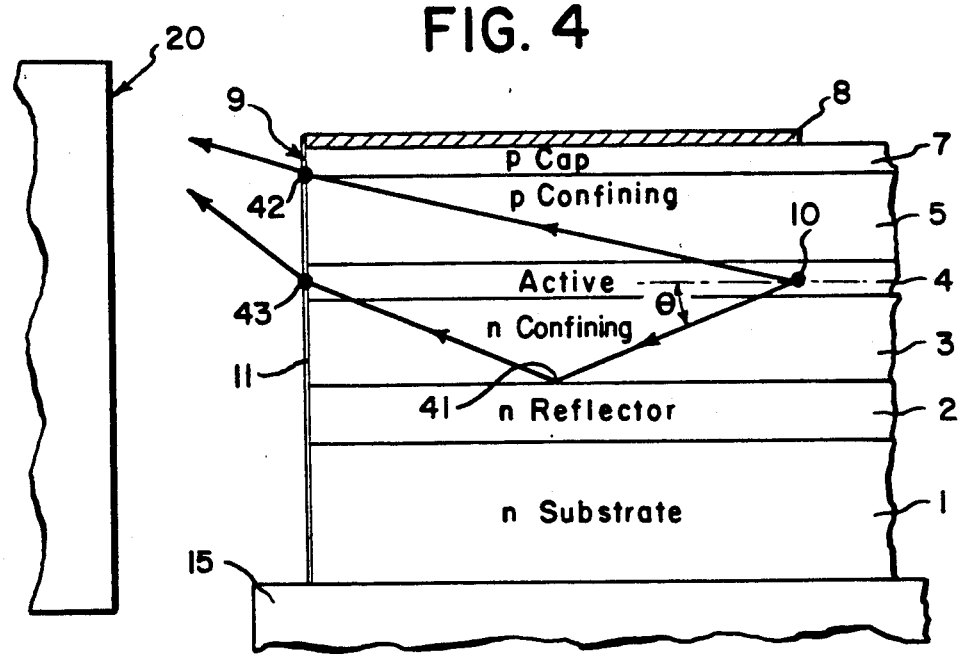
FIG. 4 is a cross-sectional drawing of a third embodiment of an edge-emitting light emitting diode of the present invention.

FIG. 4 is a cross-sectional drawing (not to scale) of an asymmetric cutoff single reflector LED of the present invention. As in Examples 1 and 2, the thickness of active layer 4 and the composition of n-type confining layer 3, active layer 4 and p-type confining layer 5 are chosen so that carrier recombination is confined primarily within active layer 4 and the generated light is not confined to the active layer.

The embodiment shown in Example 3 is the same as that shown in Example 1 except that p-type reflector layer 6 is absent and the p-type confining layer 5 is thinner than its optimum value.

Optical radiation generated at endpoint 10 travels through the device within a cone outlined by the rays from endpoint 10 to point 42 and from endpoint 10 to reflection point 41 to point 43. The optical radiation then passes through anti-reflective coating 11 on emitting facet 9 to be accepted by the optical fiber.

While this structure does not provide for maximum light output, it is simpler to fabricate and has improved thermal impedance and reduced current spreading. A recent sample of 20 LEDS from 6 wafers had the following coupled power into 50 μm fiber, 0.2 NA, at 125 ma: average power=198 microwatt, minimum power=175 microwatts, maximum power=232 microwatts.

EXAMPLE 4

Figure 5:
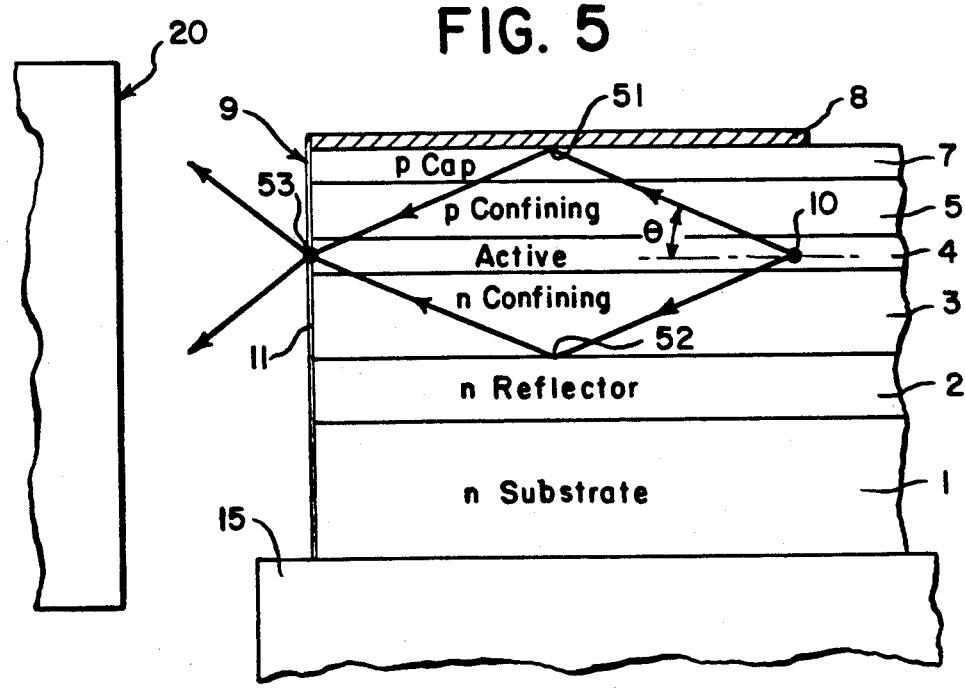
FIG. 5 is a cross-sectional drawing of a fourth embodiment of an edge-emitting light emitting diode of the present invention.

FIG. 5 is a cross-sectional drawing (not to scale) of an asymmetric cutoff double reflector LED with a metal reflector. The thicknesses and compositions of the layers are the same as in Example 1 except that p-type reflector layer 6 is absent. Optical radiation generated in active layer 4 at endpoint 10 travels through the device within a cone outlined by the rays from endpoint 10 to reflection point 51 to exit point 53 and from endpoint 10 to reflection point 52 to exit point 53. The optical radiation then passes through anti-reflective coating 11 on emitting facet 9 to be accepted by the optical fiber.

The composition of p-type cap layer 7 is chosen so that the aluminum concentration $x_7$ of p-type cap layer 7 is greater than the aluminum concentration $x_4$ of active layer 4. This aluminum concentration relationship ensures that p-type cap layer 7 will be substantially transparent to the optical radiation travelling in the device, so that, at the frequency of the light generated in active layer 4, the energy absorption coefficient of the material of p-type cap layer 7 is so low that the material is substantially non-absorbing to such light. The optical radiation produced in active layer 4 will thus pass through p-type confining layer 5 and p-type cap layer 7 to be reflected by metal ohmic contact stripe 8. Preferably, the thickness $d_7$ of p-type cap layer 7 is greater than the thickness $d_5$ of p-type confining layer 5, although the value of $d_7$ may be reduced and the value of $d_5$ increased to maintain the same device dimension. No reflection occurs at the interface of p-type confining layer 5 and cap layer since the conditions for total internal reflection are not met.

Different fabrication techniques may be used to form the structures shown. For example, Liquid Phase Epitaxy (LPE) or Vapor Phase Epitaxy (VPE) techniques, such as Molecular Beam Epitaxy (MBE) or Metalorganic Chemical Vapor Deposition (MOCVD), may be employed.

While the invention has been described in conjunction with specific embodiments, it is evident that numerous alternatives, modifications, and variations will be apparent to those skilled in the art in light of the foregoing description.

For example, our invention may be practiced using other types of materials such as the $In_{1-x}Ga_xAs_yP_{1-y}$ material system. LEDs made of this material infrared radiation in the spectrum 1.1–1.6 μm, where optical fibers have lowest loss. By using such material with the asymmetric cutoff waveguide LED structure of the present invention, infrared radiation can be efficiently generated and emitted from the active region. In addition, the device can be fabricated with a relatively thick active layer compared to the standard symmetric, double-heterojunction structure. This has an added advantage for InGaAsP devices since the internal quantum efficiency of such devices is proportional to active layer thickness. For thinner active layers, non-radiative Auger processes become more probable and light output decreases for fixed current density. Thus, InGaAsP devices with thick active layers embedded in a cutoff waveguiding structure will be highly efficient emitters.

Figure 6:
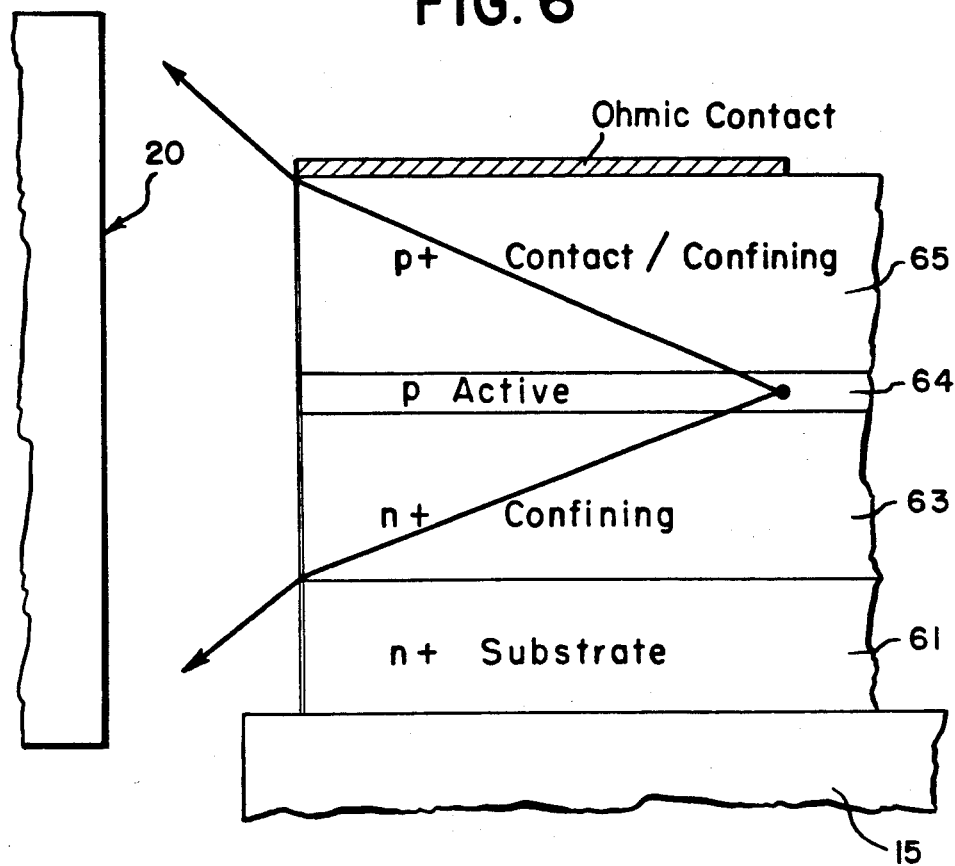
FIG. 6 is a cross-sectional drawing of a fifth embodiment of an edge-emitting light emitting diode of the present invention.

One advantageous structure of an InGaAsP LED is shown in FIG. 6. This LED comprises a quarternary p-type active layer 64 surrounded by an n+-type InP layer 63 and a second quarternary p+-type layer 65. InP layer 63 is mounted on an n+-type substrate 62 which in turn is mounted on a heat sink 15 as in the case of the LEDs of FIGS. 2–5. InP layer 63 serves as a hole barrier. Layer 65 serves three purposes: (1) confinement of electrons, (2) ohmic connection to ohmic contact 8 and (3) creation of an asymmetric cutoff waveguide structure, the latter permitting photons generated in active layer 64 to escape into transparent, non-absorbing layer 65 or InP layer 62. The device operates in the same fashion as the device illustrated in FIG. 3 with light being generated in active layer 64 and emitted through facet 9 into optical fiber 20.

The design of a device for emission at $\lambda = 1.3$ μm is illustrative of this embodiment of the invention. Design equations for the quarternary composition, $In_{1-x}Ga_xAs_yP_{1-y}$, are set forth in T. P. Pearsall, *GaInAsP Alloy Semiconductors*:

$$Eg = 1.35 - 0.72y + 0.12y^2 \quad (7)$$

$$x = y/2.197 \quad (8)$$

For active layer 64, an appropriate value of Eg is 0.95 eV; and the quarternary composition of layer 64 accordingly is $In_{0.72}Ga_{0.28}As_{0.62}P_{0.38}$. The refractive index of this layer is 3.523. The InP confining layer 63 has refractive index n = 3.155. The composition layer 65 must provide an adequate electron barrier, which requires for this layer that the band gap potential be approximately 0.25 eV greater than that of active layer 64. Accordingly, for Eg = 1.2 eV, the composition of layer 65 can be then found from equations (7) and (8) to be:

$$In_{0.90}Ga_{0.10}As_{0.22}P_{0.78}$$

and the refractive index for this composition is:

$$n = 3.30$$

Using known electromagnetic waveguide theory set forth, for example, in Kressel and Butler, *Semiconductor Lasers and Heterojunction LEDs*, it can be shown that for active layer thicknesses less than or equal to 0.11 μm, no active layer wave guiding is possible. Thus high external LED efficiency can be achieved. In contrast, the standard symmetric double-heterostructure, with an InP layer in place of quarternary layer 65, traps the light in the active layer where it is reabsorbed.

What is claimed is:

1. In a light emitting diode of the edge-emitting type comprising a plurality of contiguous semiconductor layers one of which forms an active layer with a p-n junction thereat and into which carriers are injected when a bias voltage is applied and from which electromagnetic radiation is produced, means for applying said bias voltage to at least a portion of said p-n junction; and means to establish a transverse optical cavity for allowing efficient propagation of optical radiation in a direction parallel to said active layer when said bias voltage is applied across said junction with electromagnetic radiation being emitted from said diode at an end surface thereof, said means comprising:

a first confining layer of n-type semiconductor material of a first composition located within said optical cavity contiguous with said active layer for confining carriers in said active layer and having such a thickness that said electromagnetic radiation that leaves said end surface from said first confining layer at an exit angle within the numerical aperture of a receiving optical fiber travels through said first confining layer with no more than one reflection by another layer of said diode thereby minimizing the amount of electromagnetic energy absorbed; and a second confining layer of p-type semiconductor material of a second composition located within said optical cavity contiguous with a surface of said active layer not in contact with said first confining layer for confining carriers in said active layer and having such a thickness that said electromagnetic radiation that leaves said end surface from said second confining layer at an exit angle within said numerical aperture of said receiving optical fiber travels through said second confining layer with no more than one reflection by another layer of said diode thereby minimizing the amount of electromagnetic energy absorbed;

said first and second confining layers having different compositions, said first confining layer and said active layer and said second confining layer and said active layer having sufficient compositional differences to confine electrical carriers to said active layer, said compositions of said confining layers and said active layer thickness being selected so that the confinement factor, $\gamma$, is approximately zero and substantially all of said electro-magnetic radiation produced in said active layer leaves said active layer and enters said first and second confining layers.

2. The light emitting diode of the edge-emitting type of claim 1 wherein said semiconductor layers comprise a ternary compound.

3. The light emitting diode of claim 2 wherein said active layer has a thickness of at least 0.15 microns, said first confining layer has a composition of $Al_{0.15}Ga_{0.85}As$, said second confining layer has a composition of $Al_{0.25}Ga_{0.75}As$, and said active layer has a composition of $Al_{0.05}Ga_{0.95}As$.

4. The light emitting diode of claim 1 wherein said semiconductor layers are formed of $Al_xGa_{1-x}As$ and the difference in the aluminum composition ratio x between said active layer and said n-type confining layer is at least 0.1 and the difference in the aluminum composition ratio x between said active layer and said p-type confining layer is at least 0.2.

5. The light emitting diode of claim 1 wherein said electromagnetic radiation that leaves said n-type confining layer and is accepted by said optical fiber is not reflected by any layer of said diode.

6. The light emitting diode of claim 1 wherein said electromagnetic radiation that leaves said p-type confining layer and is accepted by said optical fiber is not reflected by any layer of said diode.

7. The light emitting diode of claim 1 wherein said end surface is coated with an anti-reflective coating.

8. The light emitting diode of claim 1 wherein said electromagnetic radiation that leaves one of said confining layers and is accepted by said optical fiber is reflected once by a metallic cap layer of said diode.

9. The light emitting diode of claim 1 wherein one of said confining layers comprises a quarternary compound.

10. The light emitting diode of claim 9 wherein said quarternary compound is InGaAsP and the relative concentrations of the elements of compound are selected to provide an electron band gap greater than that of said active layer.

11. The light emitting diode of claim 9 wherein said quarternary compound is InGaAsP, the composition of the active layer is $In_{0.72}Ga_{0.38}As_{0.62}P_{0.38}$, the composition of one of said confining layers is $In_{0.90}Ga_{0.10}As_{0.22}P_{0.78}$, and the composition of said other confining layer is InP.

12. A light emitting diode of the edge-emitting type comprising:
- a first confining layer of n-type semiconductor material of a first composition having an end surface from which electromagnetic radiation is emitted;
- a second confining layer of p-type semiconductor material of a second composition having an end surface from which electromagnetic radiation is emitted;
- an active semiconductor layer located between said n-type and p-type confining layers and forming a p-n junction with one of said confining layers, carriers being injected into said active layer when a bias voltage is applied to said diode and from which electromagnetic radiation is produced; and
- means for confining electrical carriers in said active layer;
- said compositions of said first and second confining layers and said active layer thickness being selected so the confinement factor, $\gamma$, is approximately zero and substantially all electromagnetic radiation produced in said active layer leaves said active layer and enters said first and second confining layers.

13. The light emitting diode of claim 12 wherein said semiconductor layers are formed of $Al_xGa_{1-x}As$ and said means for confining electrical carriers are a difference in the aluminum composition ratio x between said active layer and said n-type semiconductor confining layer that is at least 0.1 and a difference in the aluminum composition ratio between said active layer and said p-type confining layer that is at least 0.2.

14. The light emitting diode of claim 9 wherein said active layer has a thickness of at least 0.15 microns, said n-type semiconductor confining layer has a composition of $Al_{0.15}Ga_{0.85}As$, said p-type confining layer has a composition of $Al_{0.25}Ga_{0.75}As$, and said active layer has a composition of $Al_{0.05}Ga_{0.95}As$.

15. The light emitting diode of claim 12 wherein one of said confining layers comprises a quarternary compound.

16. The light emitting diode of claim 15 wherein said quarternary compound is InGaAsP and the relative concentrations of the elements of said compound are selected to provide an electron band gap greater than that of said active layer.

17. The light emitting diode of claim 15 wherein said quarternary compound is INGaASP, the composition of said active layer is $In_{0.72}Ga_{0.28}As_{0.62}P_{0.38}$, the composition of one of said confining layers is $In_{0.90}Ga_{0.10}As_{0.22}P_{0.78}$, and the composition of said other confining layer is InP.

18. A light emitting diode of the edge-emitting type comprising:
- a first confining layer of n-type semiconductor material of a first composition;
- a second confining layer of p-type semiconductor material of a second composition;
- an active semiconductor layer located between said n-type and p-type confining layers, forming a p-n junction with one of said confining layers, carriers being injected into said active layer when a bias voltage is applied to said diode and from which electromagnetic radiation is produced; and
- a reflector means located on a surface of each confining layer not in contact with the active layer to reflect radiation back into the confining layer, each confining layer having a thickness such that said electromagnetic radiation is emitted from an end surface of the confining layer with no more than one reflection by said reflecting means thereby minimizing the amount of electromagnetic energy absorbed;
- said first and second confining layers having different composition, said first confining layer and said active layer and said second confining layer and said active layer having sufficient compositional differences to confine electrical carriers to said active layer, said compositions of said first and second confining layers and said active layer thickness being selected so the confinement factor, $\gamma$, is approximately zero and substantially all of said electromagnetic radiation produced in said active layer leaves said active layer and enters said first and second confining layers.

19. The light emitting diode of claim 18 wherein said active layer has a thickness of at least 0.15 microns, said n-type semiconductor confining layer has a composition of $Al_{0.15}Ga_{0.85}As$, said p-type confining layer has a composition of $Al_{0.25}Ga_{0.75}As$, and said active layer has a composition of $Al_{0.05}Ga_{0.95}As$.

20. The light emitting diode of claim 18 wherein the composition of said active layer is $In_{0.72}Ga_{0.28}As_{0.62}P_{0.38}$, the composition of one of said confining layers is $In_{0.90}Ga_{0.10}As_{0.22}P_{0.78}$, and the composition of said other confining layer is InP.

21. The light emitting diode of claim 18 wherein the compositions of said confining layers are different so as to form an asymmetric structure.

* * * * *